US006591331B1

(12) United States Patent
Khanna

(10) Patent No.: US 6,591,331 B1
(45) Date of Patent: Jul. 8, 2003

(54) METHOD AND APPARATUS FOR DETERMINING THE ADDRESS OF THE HIGHEST PRIORITY MATCHING ENTRY IN A SEGMENTED CONTENT ADDRESSABLE MEMORY DEVICE

(75) Inventor: Sandeep Khanna, Santa Clara, CA (US)

(73) Assignee: Netlogic Microsystems, Inc., Mountain View, CA (US)

(*) Notice: Subject to any disclaimer, the term of this patent is extended or adjusted under 35 U.S.C. 154(b) by 0 days.

(21) Appl. No.: 09/455,726

(22) Filed: Dec. 6, 1999

(51) Int. Cl.$^7$ ............................................... G06F 12/00
(52) U.S. Cl. ...................... 711/108; 711/147; 711/154; 711/170; 365/49
(58) Field of Search .................. 365/189.01, 189.08, 365/49; 711/101, 108, 147, 151, 153, 154, 170, 173

(56) References Cited

U.S. PATENT DOCUMENTS

| | | | | |
|---|---|---|---|---|
| 4,890,260 A | * | 12/1989 | Chuang et al. ................. | 365/49 |
| 4,928,260 A | * | 5/1990 | Chuang et al. ................. | 365/49 |
| 5,123,105 A | | 6/1992 | Wyland et al. ................. | 395/725 |
| 5,319,589 A | * | 6/1994 | Yamagata et al. ............. | 365/49 |
| 5,394,353 A | * | 2/1995 | Nusinov et al. ............... | 365/49 |
| 5,511,222 A | | 4/1996 | Shiba et al. .................. | 395/800 |
| 5,555,397 A | * | 9/1996 | Sasama et al. ............... | 711/158 |
| 5,568,485 A | | 10/1996 | Chaisemartin ............. | 370/85.6 |
| 5,602,545 A | | 2/1997 | Ishii et al. ..................... | 341/50 |
| 5,619,446 A | * | 4/1997 | Yoneda et al. ................. | 365/49 |
| 5,726,942 A | | 3/1998 | Yoneda et al. ............... | 365/208 |
| 5,818,786 A | | 10/1998 | Yoneda | |
| 5,949,734 A | | 9/1999 | Matano ................... | 365/230.03 |
| 5,973,950 A | | 10/1999 | Shindo ......................... | 365/49 |
| 5,978,246 A | | 11/1999 | Shindo ......................... | 365/49 |
| 6,069,573 A | * | 5/2000 | ClarkI et al. .................. | 341/50 |

FOREIGN PATENT DOCUMENTS

JP        05189979       7/1993
WO       WO9854725     12/1998

OTHER PUBLICATIONS

Tamaru, Keikichi. "The Trend of Functional Memory Development," *IEICE Trans. Electron.*, vol. E76–C, No. 11 (Nov. 1993), pp. 1545–1554.

* cited by examiner

*Primary Examiner*—Do Hyun Yoo
*Assistant Examiner*—Christian P. Chace
(74) *Attorney, Agent, or Firm*—Blakely Sokoloff Taylor & Zafman LLP

(57) ABSTRACT

A method and apparatus for determining the address of a highest priority matching entry in a segmented content addressable memory device. For one embodiment, a segmented CAM device is disclosed that includes m CAM array blocks each having n rows of CAM cells coupled to one of n corresponding match lines. The CAM array blocks have a predetermined priority based on their addresses such that the first CAM array block has the highest priority addresses and the mth CAM array block has the lowest priority addresses. Comparand data is provided for comparison with entries in each of the CAM array blocks. Each row of CAM cells in each block has a row enable logic circuit. A main priority encoder is coupled to the row enable logic circuits of the mth CAM array block. Each CAM array block also has an associated match flag circuit to determine a match flag signal for the block. A block priority encoder encodes the match flag signals into a block address of the highest priority matching location. The block address is provided to a decoder that decodes the block address. The decoded block address enables one of the groups of row enable logic circuits associated with the CAM array block having the highest priority matching location to provide its match results to the main priority encoder. The main priority encoder determines the subblock address of the matching entry in that CAM array block. The block address and the subblock address form the address of the highest priority matching entry or location in the entire CAM array.

15 Claims, 5 Drawing Sheets

US 6,591,331 B1

METHOD AND APPARATUS FOR DETERMINING THE ADDRESS OF THE HIGHEST PRIORITY MATCHING ENTRY IN A SEGMENTED CONTENT ADDRESSABLE MEMORY DEVICE

FIELD OF THE INVENTION

The present invention relates generally to content addressable memory (CAM) devices.

BACKGROUND

A content addressable memory (CAM) device is a storage device that can be instructed to compare a specific pattern of comparand data with data stored in its associative CAM array. The entire CAM array, or segments thereof, is searched in parallel for a match with the comparand data. If a match exists, the CAM device indicates the match by asserting a match flag. Multiple matches may also be indicated by asserting a multiple match flag. The CAM device typically includes a priority encoder to translate the highest priority matching location into a match address or CAM index.

When the CAM array is segmented into many CAM array blocks, the priority encoder may also be distributed or segmented such that each block has its own encoder. The outputs of the encoders can then be combined to generate the address of the highest priority matching location. This approach, however, may use a significant amount of die area in an integrated circuit to implement the distributed priority encoder. Other approaches have suggested a hierarchical priority encoding scheme that includes a main priority encoder and a subblock priority encoder. The subblock priority encoder monitors the match signals from the individual blocks and sequentially enables each block to provide its match results to the main priority encoder. This approach may require a significant amount of time to reach the block having the highest priority matching entry.

SUMMARY OF THE INVENTION

A method and apparatus for determining the address of a highest priority matching entry in a segmented content addressable memory device is disclosed. For one embodiment, a segmented CAM device is disclosed that includes m CAM array blocks each having n rows of CAM cells coupled to one of n corresponding match lines. The CAM array blocks have a predetermined priority based on their addresses such that the first CAM array block has the highest priority addresses and the mth CAM array block has the lowest priority addresses. Comparand data is provided for comparison with entries in each of the CAM array blocks. Each row of CAM cells in each block has arrow enable logic circuit. A main priority encoder is coupled to the row enable logic circuits of the mth CAM array block. Each CAM array block also has an associated match flag circuit to determine a match flag signal for the block. A block priority encoder encodes the match flag signals into a block address of the highest priority matching location. The block address is provided to a decoder that decodes the block address. The decoded block address enables one of the groups of row enable logic circuits associated with the CAM array block having the highest priority matching location to provide its match results to the main priority encoder. The main priority encoder determines the subblock address of the matching entry in that CAM array block. The block address and the subblock address form the address of the highest priority matching entry or location in the entire CAM array.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
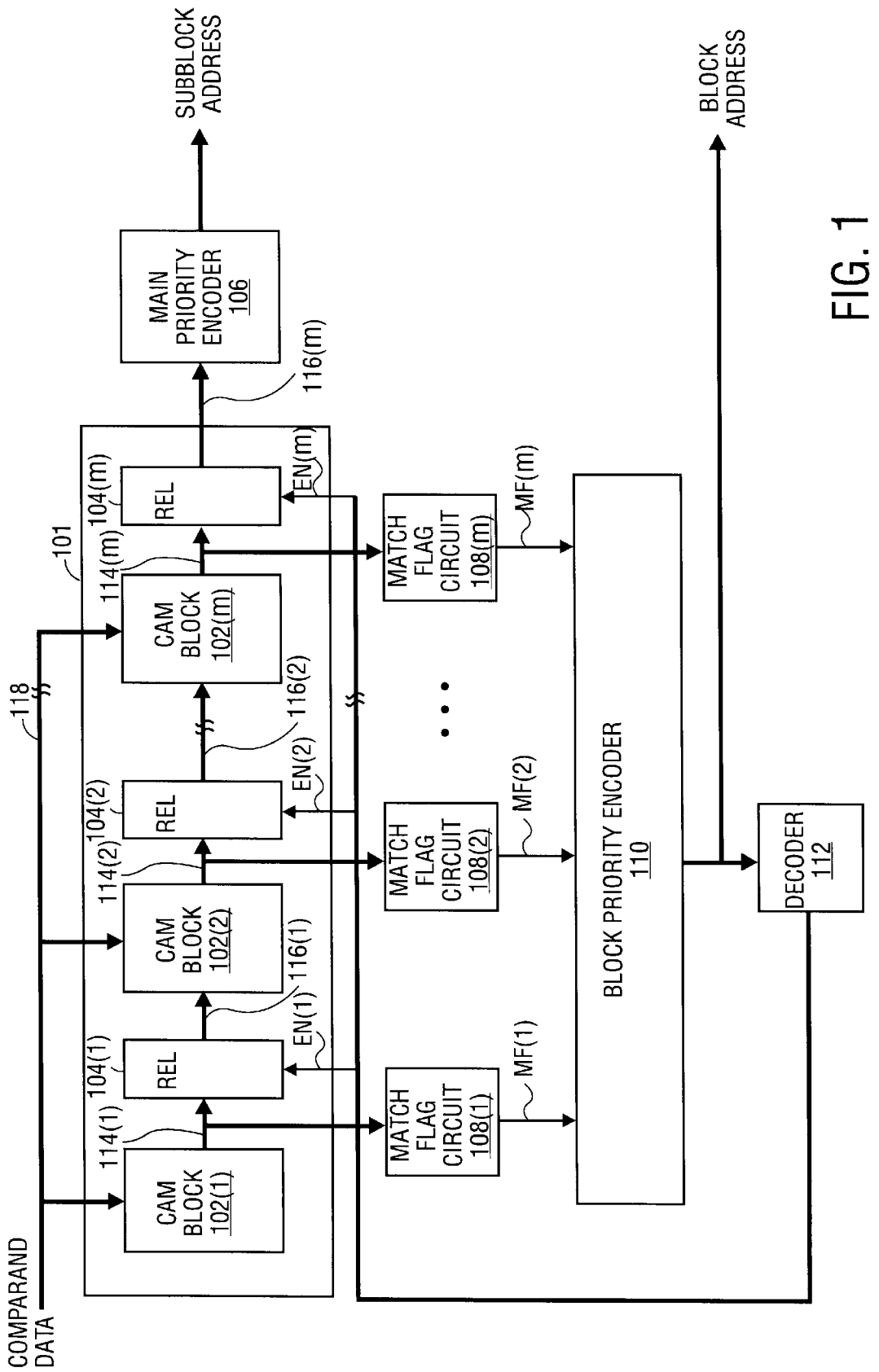
FIG. 1 is a block diagram of one embodiment of a CAM device according to the present invention.

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicates that the signal is an active low signal. Each of the active low signals may be changed to active high signals as generally known in the art.

A method and apparatus for determining the address of a highest priority matching entry in a segmented content addressable memory device is disclosed. For one embodiment, a segmented CAM device is disclosed that includes m CAM array blocks each having n rows of CAM cells coupled to one of n corresponding match lines. The CAM array blocks have a predetermined priority based on their addresses such that the first CAM array block has the highest priority addresses and the mth CAM array block has the lowest priority addresses. Comparand data is provided for comparison with entries in each of the CAM array blocks. Each row of CAM cells in each block has a row enable logic circuit. A main priority encoder is coupled to the row enable logic circuits of the mth CAM array block. Each CAM array block also has an associated match flag circuit to determine a match flag signal for the block. A block priority encoder encodes the match flag signals into a block address of the highest priority matching location. The block address is provided to a decoder that decodes the block address. The decoded block address enables one of the groups of row enable logic circuits associated with the CAM array block having the highest priority matching location to provide its match results to the main priority encoder. The main priority encoder determines the subblock address of the matching entry in that CAM array block. The block address and the subblock address form the address of the highest priority matching entry or location in the entire CAM array.

The architecture of the present invention shares the main priority encoder with all of the CAM block arrays. This enables the main priority encoder to be relatively small when compared with architectures that provide a separate priority encoder for each CAM array block. Reducing the circuitry for the priority encoding scheme allows for higher circuit integration on a given semiconductor substrate. Additionally, the present invention does not sequentially cycle through each CAM array block to output match results therefrom to the main priority encoder. In contrast, by decoding the block address, the match results from the CAM array block with the highest priority matching entry can be directly provided to the main priority encoder at the earliest opportunity without cycling through previous blocks that do not have matching entries. This can improve the operating speed of the CAM device over conventional priority encoding schemes.

FIG. 1 shows CAM device 100 that is one embodiment of a CAM device according to the present invention. CAM device 100 includes a CAM array 101 that is segmented into m CAM array blocks 102(1)–102(m) each having n rows of CAM cells coupled to n match lines 114(1)–114(m), respectively, where m and n are greater than or equal to one. The rows of CAM cells may include any type of CAM cells including binary or ternary CAM cells. CAM array block 102(1) is the highest priority CAM array block, block 102(2) is the next highest CAM array block, and block 102(m) is the lowest priority CAM array block. For example, block 102(1) has addresses 1 to n, block 102(1) has addresses n+1 to 2n, and so on, with block 102(m) having the final block of addresses up to (m×n). For this example, an entry in CAM block 102(1) that matches comparand data provided on bus 118 would be considered a higher priority matching entry than an entry in CAM block 102(m) that also matches the comparand data.

Match lines 114(1)–114(m) are each provided to match flag circuits 108(1)–108(m), respectively. Each match flag circuit determines the state of a match flag signal MF in response to the logical states of the corresponding match lines. For one embodiment, each match flag circuit may be an OR circuit or a wired-OR circuit. For other embodiments, each match flag circuit may be any other type of match flag circuit.

CAM device 100 has priority encoding circuitry that includes main priority encoder 106 and block priority encoder 110. Main priority encoder 106 determines the subblock address of the entry in one of the CAM array blocks that matches the comparand data on bus 118. Block priority encoder 110 receives the match flag signals MF(1)–MF(m) and generates a block address. The block address is an indication of the CAM array block that stores the highest priority matching location. The block address and the subblock address can then be combined to form the address of the highest priority matching entry in the entire CAM array 101.

The block address determines which match results are provided to main priority encoder 106. The block address is provided to decoder 112 that decodes the block address and provides the decoded address as enable signals EN(1)–EN(m) to row enable logic (REL) circuit blocks 104(1)–104(m), respectively. Each REL circuit block 104(x) is a group of row enable circuits that, in response to an enable signal EN(x), provides to the next CAM array block 102(x+1) or to the next REL circuit block 104(x+1) either: (i) the signals on the match lines 114(x), or (ii) the signals from the previous REL circuit block 104(x−1).

For example, assume that CAM array block 102(2) has the highest priority matching entry when compared with the comparand data on bus 118. In this example, MF(2) is asserted to the appropriate logic state indicating a match in CAM array block 102(2), and MF(1) is asserted to the appropriate logic state indicating a mismatch in CAM array block 102(1). Block priority encoder 110 determines a block address corresponding to CAM array block 102(2). For one embodiment, the block address may be a binary encoded address of the MF signals. In response to the block address, decoder 112 asserts EN(2) to an appropriate logic state such that REL circuit block 104(2) is enabled. Decoder 112 also asserts EN(1) and EN(3)–EN(m) to appropriate logic states such that REL circuit blocks 104(1) and 104(3)–104(m) are disabled. When enabled, REL circuit block 104(2) provides the logic state of its match line signals on match lines 114(2) to the next lower priority CAM array block 102(3) and/or REL circuit block 104(3) on signal lines 116(2). Since REL circuit block 104(3) is disabled, it passes the signals from REL circuit block 104(2) to signal lines 116(3). Since each of the REL circuit blocks 104(4)–104(m) are also disabled, they pass the signals from REL circuit block 104(2) eventually to signal lines 116(m) and main priority encoder 106.

Figure 2:
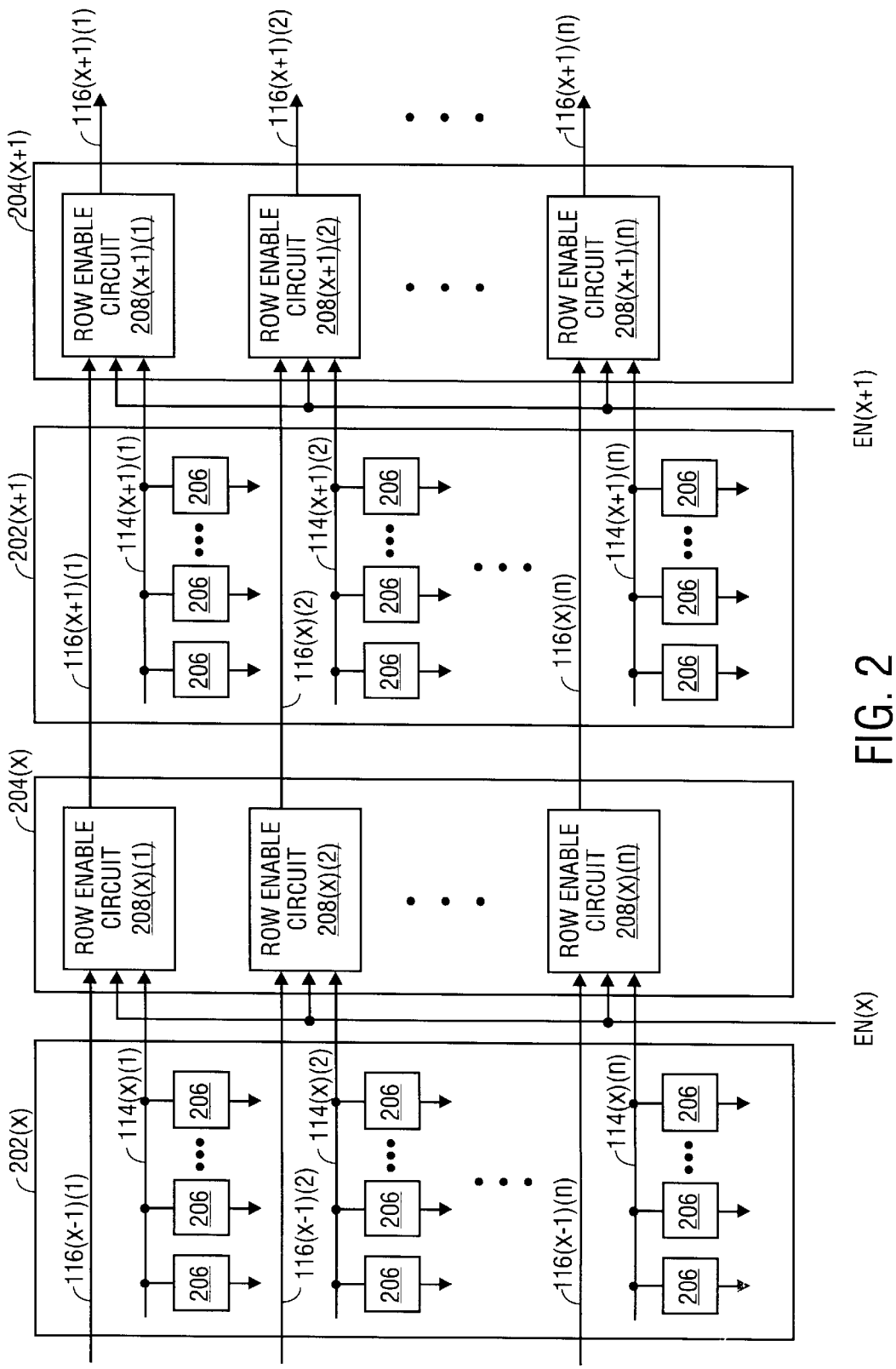
FIG. 2 is a logic diagram of one embodiment of the CAM device of FIG. 1.

FIG. 2 shows CAM array blocks 202(x)–202(x+1) and REL circuit blocks 204(x)–204(x+1) that are one embodiment of CAM array blocks and REL circuit blocks of FIG. 1. CAM array block 202(x) includes multiple CAM cells 206 coupled to corresponding match lines 114(x)(1)–114(x)(n). Similarly, CAM array block 202(x+1) includes multiple CAM cells 206 coupled to corresponding match lines 114(x+1)(1)–114(x+1)(n). CAM cells 206 may be any type of CAM cells including binary or ternary CAM cells. Word lines, bit lines, and/or compare lines for communicating comparand data have been omitted for the sake of clarity.

Each REL circuit block includes one row enable circuit 208 for each row of CAM cells of the corresponding CAM array block. For example, REL circuit block 204(x) includes row enable circuits 208(x)(1)–208(x)(n) each having an input to receive a match signal from match lines 114(x)(1)–114(x)(n), respectively, of CAM array block 202(x). Each row enable circuit 208 in a particular REL circuit block also receives one of the enable signals. Each row enable circuit 208(x)(1)–208(x)(n) also provides an output signal on signal lines 116(x)(1)–116(x)(n), respectively, to a corresponding row enable circuit 208(x+1)(1)–208(x+1)(n) in REL circuit block 204(x+1).

When enable signal EN(x+1), for example, is asserted to a logic state indicating that CAM array block 202(x+1) has the highest priority matching entry, row enable circuits 208(x+1)(1)–208(x+1)(n) provide the signals on match lines 114(x+1)(1)–114(x+1)(n) as output signals to signal lines 116(x+1)(1)–116(x+1)(n). When, however, enable signal EN(x+1) is asserted to a logic state indicating that CAM array block 202(x+1) does not have the highest priority matching entry, row enable circuits 208(x+1)(1)–208(x+1)(n) provide the output signals from the previous row enable circuits 208(x)(1)–208(x)(n) as output signals to signal lines 116(x+1)(1)–116(x+1)(n).

Any logic or circuits may be used for the row enable circuits 208 to implement the function described above. Table 1 shows one example of a truth table for implementing row enable circuit 208(x)(1), and may also be used to implement all other row enable circuits. Other truth tables may be used (and corresponding logic generated accordingly) including those that logically complement one or more of the signals indicated in Table 1.

TABLE 1

| STATE | EN(x) | 114(x)(1) | 116(x − 1)(1) | 116(x)(1) |
|---|---|---|---|---|
| 0 | 0 | 0 | 0 | 0 |
| 1 | 0 | 0 | 1 | 1 |
| 2 | 0 | 1 | 0 | 0 |
| 3 | 0 | 1 | 1 | 1 |
| 4 | 1 | 0 | 0 | 0 |

TABLE 1-continued

| STATE | EN(x) | 114(x)(1) | 116(x − 1)(1) | 116(x)(1) |
|---|---|---|---|---|
| 5 | 1 | 0 | 1 | — |
| 6 | 1 | 1 | 0 | 1 |
| 7 | 1 | 1 | 1 | — |

Table 1 assumes that a match condition is indicated on the match line 114(x)(1) by a high logic state, and a mismatch is indicated by a low logic state. Table 1 also assumes that the row enable circuit is enabled when EN(x) is a high logic state. Note that states 5 and 7 should not occur since the enable signal EN(x) for row enable circuit 208(x)(1) should not be asserted to a high logic state if a higher priority row enable circuit has asserted signal line 116(x−1)(1) to a high logic state indicating a matching location in a higher priority CAM array block. For other truth tables, states 5 and 7 may occur.

Figure 3:
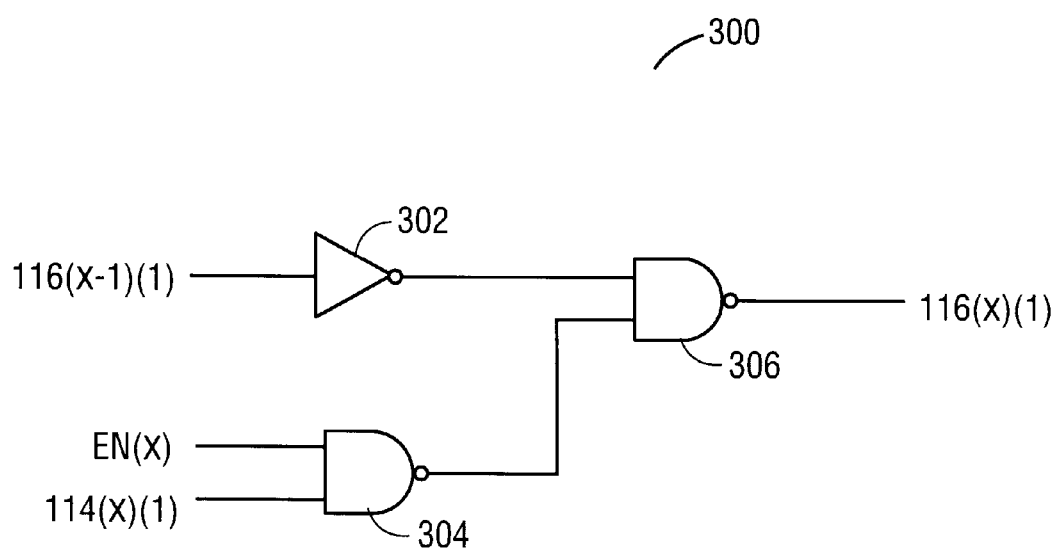
FIG. 3 is a logic diagram of one embodiment of a row enable logic circuit of FIG. 2.

Any logic or circuitry may be used to implement the truth table of Table 1. FIG. 3 shows row enable circuit 300 that is one embodiment of row enable circuit 208(x)(1). Row enable circuit 300 may be used for all row enable circuits. Row enable circuit 300 includes inverter 302 and NAND gates 304 and 306. NAND gate 304 having a first input to receive EN(x), a second input to receive the match signal from match line 114(x)(1), and an output. NAND gate 306 has a first input coupled to the output of NAND gate 304 and a second input to receive the logical complement of the signal on line 116(x−1)(1) via inverter 302. The output of NAND gate 306 is coupled to signal line 116(x)(1). When row circuit 300 is used for row enable circuits in REL circuit block 104(1) of FIG. 1, the input of inverter 302 may coupled to known state such as ground. Alternatively, inverter 302 may be removed and the input of NAND gate 306 may be coupled directly to a power supply rail.

Figure 4:
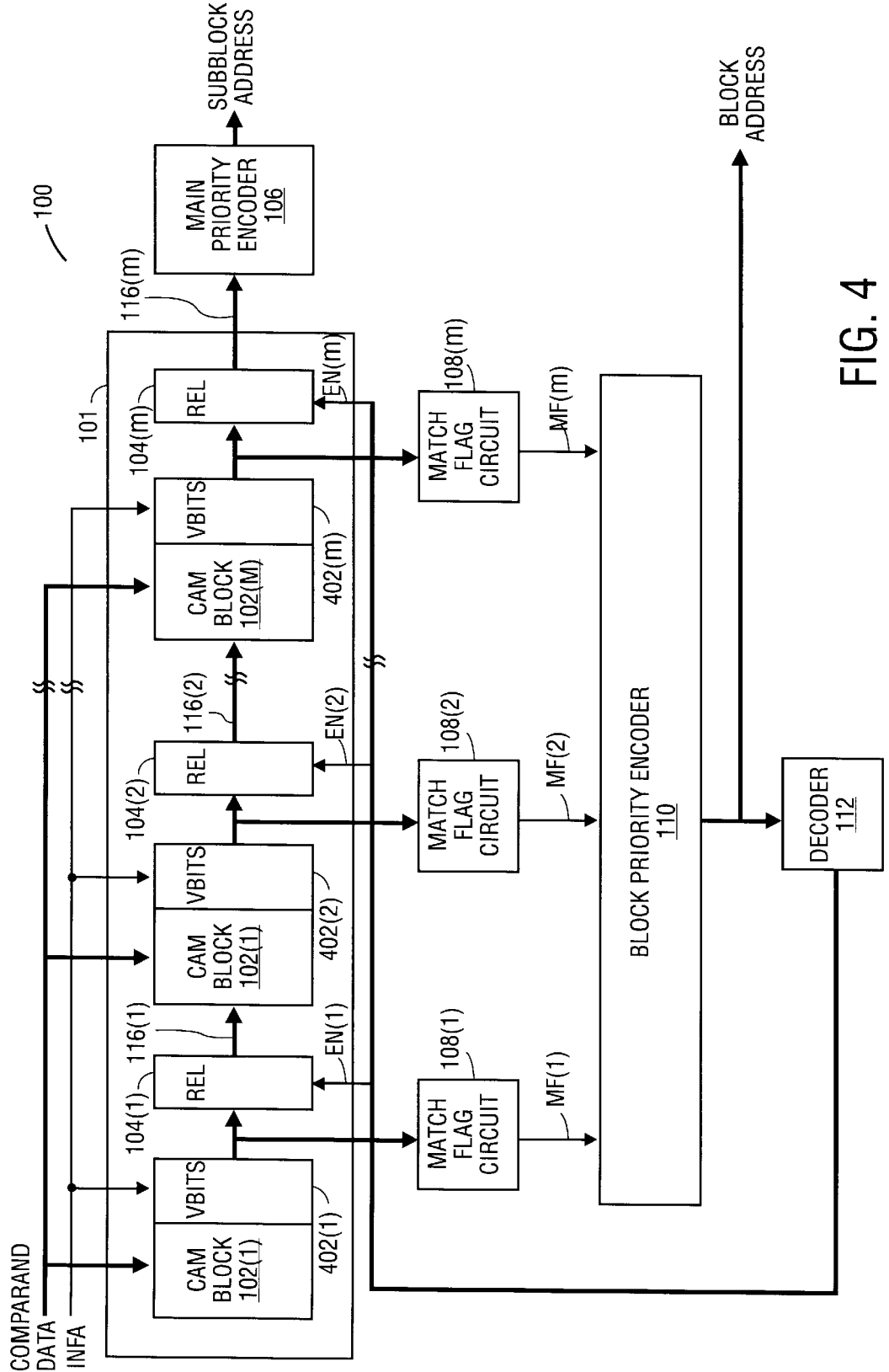
FIG. 4 is a block diagram of another embodiment of the CAM device of FIG. 1.

The distributed priority encoding scheme described above can also be used to determine the next free address or location in the entire CAM array 101 formed from the CAM array blocks. The next free address (NFA) is the location in the highest priority location that does not have a valid entry and is considered "empty." It may be desirable to know the next free address so that the user knows where the next write operation will occur, for example, when executing a "write to next free address instruction." As shown in FIG. 4, one or more validity bits (VBITS) 402 can be included within each CAM array block to store an indication of whether a corresponding row of CAM cells stores a valid entry. The validity bits may be any type of memory storage element including volatile or nonvolatile memory cells. For one embodiment, the validity bits are CAM cells.

When the CAM device performs a compare operation with the comparand data on bus 118, it operates as described above to determine the address of the highest priority matching entry in one of the CAM array blocks. When, however, the CAM device is determining the next free address in the entire CAM array, the contents of the validity bits are provided to respective REL circuit blocks and match flag circuits instead of the match signals from the rows of CAM cells within the CAM array blocks. The distributed priority encoding scheme then functions as described above to determine the next free address in the entire CAM array. The next free address may be determined, for example, after the entries of the CAM array are updated by a write, erase, or invalidate function.

For example, when the CAM device is determining the next free address in the entire CAM array 101, the control signal INFA is asserted to an appropriate logic state and the contents of the validity bits are provided to respective REL circuit blocks and the match flag circuits. The match flag signals generated by the match flag circuits will reflect whether any location in a corresponding CAM array block is empty or stores an invalid entry. Block priority encoder 110 determines the block address of the CAM array block that has the highest priority empty location. The block address is then decoded by decoder 112 to generate the enable signals. The enable signals enable one of the REL circuit blocks associated with the CAM array block that has the highest priority next free location. When the particular REL circuit block is enabled, it provides the contents of its associated validity bits to the main priority encoder via the other REL circuit blocks. The main priority encoder then determines the subblock address associated with the next free location within the CAM array block that has the highest priority next free location. The subblock address and the block address together form the highest priority next free address within the entire CAM array 101. This address may then be stored in a register or latch for use when writing to the next frees address or for reading the value of the next free address.

Figure 5:
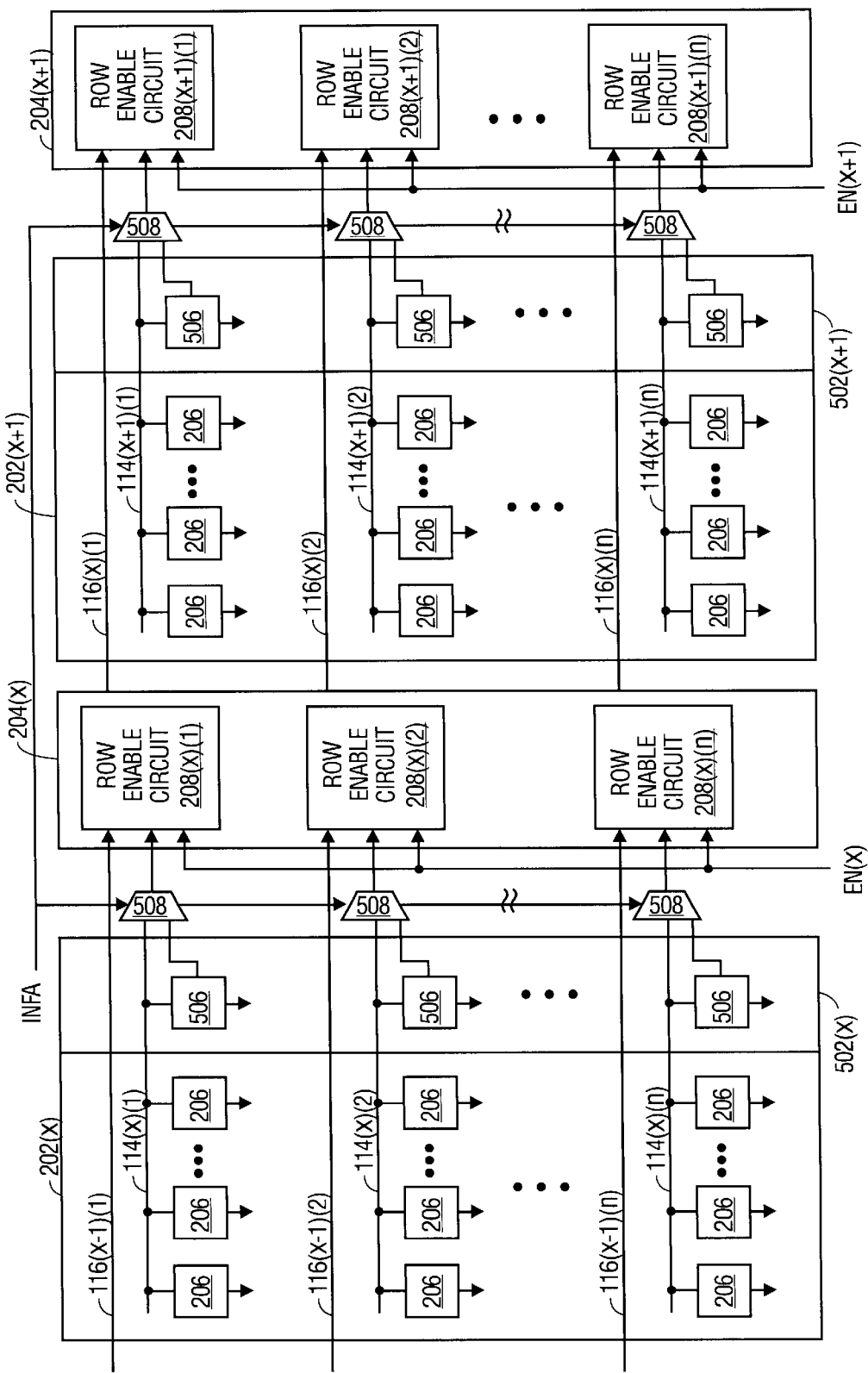
FIG. 5 is a logic diagram of one embodiment of the CAM device of FIG. 5.

FIG. 5 shows one embodiment of CAM array blocks 202(x)–202(x+1) from FIG. 2 including groups of validity bits 502(x)–502(x+1), respectively. In this embodiment, each group of validity bits includes CAM cells 506 for storing validity information for a given row of CAM cells in a CAM array block. Word lines, bit lines, and/or compare lines for communicating comparand data have been omitted for the sake of clarity. For other embodiments, each row of CAM cells in a CAM array block may have more than one CAM cell 506 for storing validity information for that row. For still other embodiments, CAM cells 506 may be other types of memory storage cells.

Additionally, a multiplexer 508 is included for each row of CAM cells 206/506. In response to INFA, each multiplexer 508 provides to a row enable circuit 208 either the match signals on match lines 114 or the validity information stored in a CAM cell 506. When operating in a compare mode to determine the next highest priority matching location in the CAM array blocks 202(x) and 202(x+1), INFA is in a first logic state such that the match results on match lines 114 are provided by multiplexers 508 to row enable circuits 208. When operating in a next free address mode to determine the highest priority next free address in the CAM array blocks 202(x) and 202(x+1) (e.g., after a write, erase, or invalidate operation of an entry in the CAM array), INFA is in a second logic state such that the validity information in CAM cells 506 is provided by multiplexers 508 to row enable circuits 208.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
    a plurality of CAM array blocks each having a plurality of rows of CAM cells coupled to a corresponding one of a plurality of match lines;
    a plurality of groups of row enable logic circuits, each group of the row enable logic circuits coupled to the plurality of match lines in a corresponding CAM array block and to another group of the row enable logic circuits;
    a first priority encoder coupled to one of the groups of row enable logic circuits;

a plurality of match flag circuits each coupled to the plurality of match lines of one of the CAM array blocks, and each configured to output a match flag signal;

a second priority encoder coupled to receive the match flag signals from the match flag circuits; and a decoder coupled between the second priority encoder and the groups of row enable logic circuits.

2. The CAM device of claim 1, wherein the decoder selects one of the CAM array blocks to provide match signals on its plurality of match lines to the first priority encoder.

3. The CAM device of claim 1, wherein the first priority encoder outputs a subblock address of one of the plurality of rows within one of the CAM array blocks, and the second priority encoder outputs a block address of one of the CAM array blocks.

4. The CAM device of claim 1, wherein at least one of the row enable logic circuits includes a first input coupled to the decoder, a second input coupled to one of the first plurality of match lines of a corresponding CAM array block, a third input coupled to an output from a row enable logic circuit in a previous group of row enable logic circuits, and an output coupled to an input of a row enable logic circuit in a next group of row enable logic circuits.

5. The CAM device of claim 1, wherein the at least one of the row enable logic circuits comprises:

a first logic circuit having a first input coupled to the decoder, a second input coupled to one of the first plurality of match lines of a corresponding CAM array block, and an output; and a second logic circuit having a first input coupled to an output from a row enable logic circuit in a previous group of row enable logic circuits, a second input coupled to the output of the first logic circuit, and an output coupled to an input of a row enable logic circuit in a next group of row enable logic circuits.

6. The CAM device of claim 5, wherein:

the first logic circuit comprises a first NAND gate; and the second logic circuit comprises an inverter coupled to the first input, and a second NAND gate coupled to the inverter and the first NAND gate.

7. The CAM device of claim 1, wherein each of the plurality of rows of CAM cells includes a memory element for storing an indication of whether the row of CAM cells stores valid data.

8. The CAM device of claim 7, wherein the memory elements comprise CAM cells.

9. The CAM device of claim 8, wherein each CAM cell is each coupled to one of the first plurality of match lines.

10. The CAM device of claim 7, further comprising a plurality of groups of multiplexers each coupled to the first plurality of match lines of a corresponding CAM array block and one of the groups of row enable logic circuits.

11. The CAM device of claim 10, wherein each multiplexer has a first input coupled to one of the first plurality of match lines of a row of CAM cells, a second input coupled to the memory element of the row of CAM cells, a select input coupled to receive a select signal, and an output coupled to one of the row enable logic circuits.

12. A content addressable memory (CAM) device comprising:

a first CAM array block having a first plurality of rows of CAM cells coupled to one of a corresponding first plurality of match lines;

a second CAM array block having a second plurality of rows of CAM cells coupled to one of a corresponding second plurality of match lines;

a first plurality of row enable logic circuits each having a first input coupled to one of the first plurality of match lines, a second input, and an output;

a second plurality of row enable logic circuits each having a first input coupled to one of the second plurality of match lines, a second input, a third input coupled to the output of a corresponding one of the first plurality of row enable logic circuits, and an output;

a first priority encoder coupled to the outputs of the second plurality of row enable logic circuits;

a first match flag circuit having inputs coupled to the first plurality of match lines, and an output;

a second match flag circuit having inputs coupled to the second plurality of match lines, and an output;

a second priority encoder having inputs coupled to the outputs of the first and second match flag circuits, and having outputs; and a decoder having inputs coupled to the outputs of the second priority encoder, a first output coupled to each of the second inputs of the first plurality of row enable logic circuits, and a second output coupled to each of the second inputs of the second plurality of row of enable logic circuits.

13. A method of determining the address of a matching entry in a content addressable memory (CAM) array having a plurality of CAM array blocks, comprising:

detecting which CAM array block has an entry that matches the comparand data;

determining a block address of the CAM array block that has the matching entry;

decoding the block address to select match results from the CAM array block having the matching entry; and encoding the match results to determine a subblock address of the matching entry within its CAM array block, wherein the block address and the subblock address form the address of the matching entry in the CAM array as a whole.

14. A method of determining the address of the highest priority free location in a content addressable memory (CAM) array having a plurality of CAM array blocks, comprising:

detecting which CAM array blocks have free locations to receive new entries;

determining a block address of the CAM array block that has the highest priority free location for the entire CAM array;

decoding the block address to select match signals from the CAM array block having the highest priority free location; and encoding the match results to determine a subblock address of the highest priority free location within its CAM array block, wherein the block address and the subblock address form the address of the highest priority free location in the CAM array as a whole.

15. The method of claim 13, further comprising providing a disabling signal to the CAM array blocks that do have the matching entry.

* * * * *